United States Patent [19]
Rossum

[11] Patent Number: 5,170,369
[45] Date of Patent: Dec. 8, 1992

[54] DYNAMIC DIGITAL IIR AUDIO FILTER AND METHOD WHICH PROVIDES DYNAMIC DIGITAL FILTERING FOR AUDIO SIGNALS

[75] Inventor: David P. Rossum, Aptos, Calif.

[73] Assignee: E-mu Systems, Inc., Scotts Valley, Calif.

[21] Appl. No.: 576,203

[22] Filed: Aug. 29, 1990

Related U.S. Application Data

[63] Continuation-in-part of Ser. No. 411,450, Sep. 25, 1989, abandoned.

[51] Int. Cl.⁵ .................................................. G06F 15/31
[52] U.S. Cl. .................................................. 364/724.17
[58] Field of Search .................. 364/724.01, 724.16, 364/724.17, 723, 748.5

[56] References Cited

U.S. PATENT DOCUMENTS

| | | | |
|---|---|---|---|
| 4,305,133 | 12/1981 | Amada et al. | 364/724.17 |
| 4,563,681 | 1/1986 | Godard | 364/724.09 |
| 4,569,030 | 2/1986 | Butterweck et al. | 364/724.17 |
| 4,573,135 | 2/1986 | Dieterich | 364/724.01 |
| 4,736,333 | 4/1988 | Mead et al. | 364/736 |

OTHER PUBLICATIONS

J. Dattorro, "The Implementation of Recursive Digital Filters for High-Fidelity Audio", Journal Audio Engineering Society, vol. 36, No. 11, Nov. 1988, pp. 851–878.

*Primary Examiner*—Long T. Nguyen
*Attorney, Agent, or Firm*—Heller, Ehrman, White & McAuliffe

[57] ABSTRACT

An improved dynamic digital IIR (Infinite Impulse Response) audio filter and method provides a remedy for the major problems in state of the art digital IIR filtering and dynamic digital filtering for audio. In particular, the required multiplier coefficient size is reduced, such that 16 bit coefficients are adequate for good frequency resolution. In addition, the data size of the multiplier is also reduced, to be similar to the input and output data resolution without inferior noise performance. Furthermore, the structure is easily modified to allow the fixing of the DC (Direct Current) gain of the IIR filter to unity regardless of coefficient choice, eliminating any problems with filter dynamic range at low frequency passbands. Additionally, a dynamic filter structure allows logarithmic filter sweeps and compresses the coefficients further down to as few as 8 bits with adequate resolution for audio throughout the band. The structure allows the alteration of sweep of the filter without excessive computation or the requirement to read the current sweep value.

7 Claims, 11 Drawing Sheets

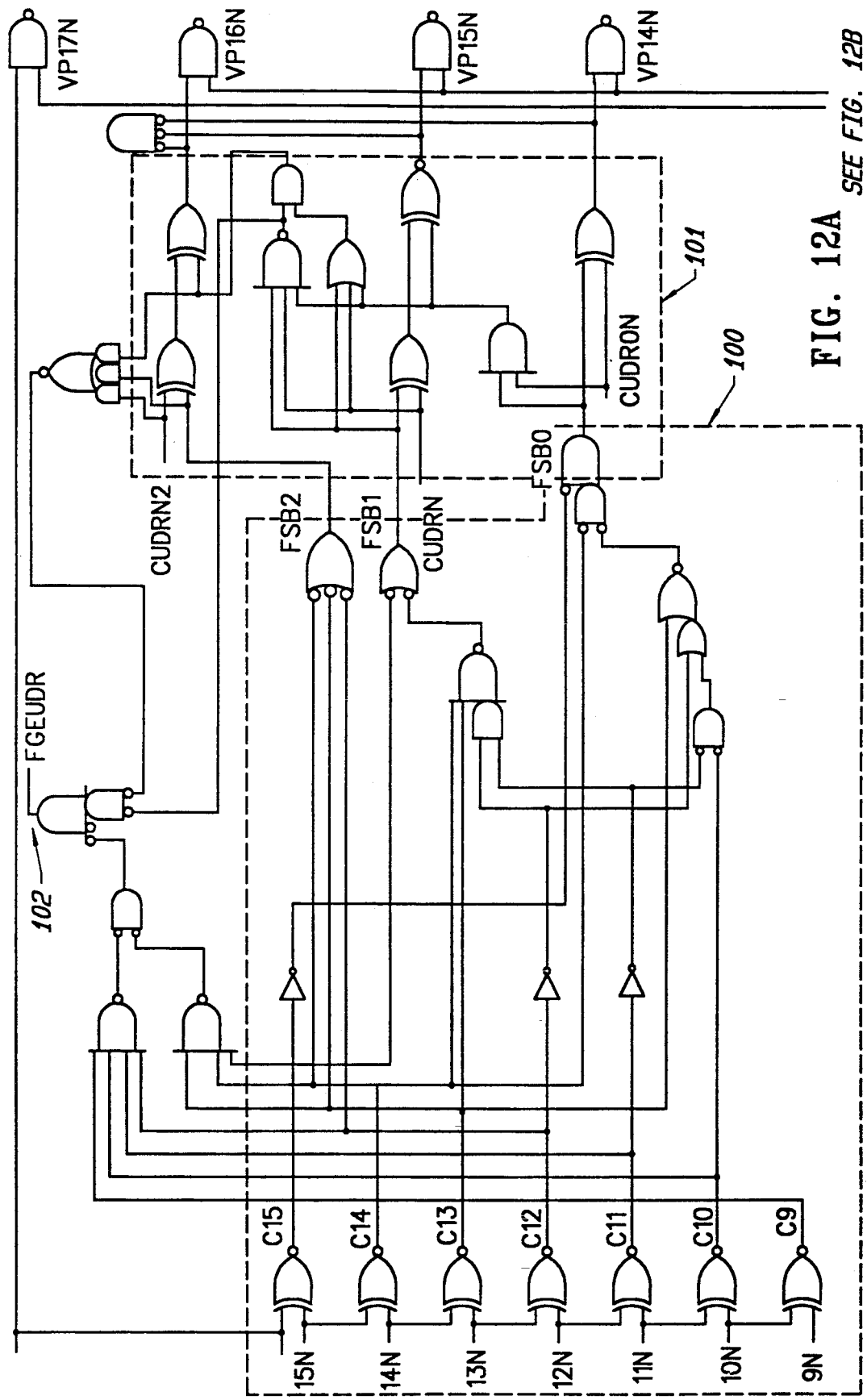
FIG. 12A  SEE FIG. 12B

DYNAMIC DIGITAL IIR AUDIO FILTER AND METHOD WHICH PROVIDES DYNAMIC DIGITAL FILTERING FOR AUDIO SIGNALS

CROSS-REFERENCE TO RELATED APPLICATIONS

The present invention is a continuation-in-part of copending patent application entitled DYNAMIC DIGITAL IIR AUDIO FILTER, Ser. No. 411,450, filed Sep. 25, 1989, now abandoned, and which is assigned to the same assignee as the present invention.

BACKGROUND OF THE INVENTION

The present invention relates to a dynamic digital IIR audio filter and corresponding method.

The current state of the art for digital infinite impulse response (IIR) filters for audio applications utilizes long wordlengths to obtain adequate noise performance for adequate sound quality. Typically 24 bit or longer coefficients are used to obtain adequate resolution at low frequencies, and 24 bit multiplier data paths or multiple precision techniques are used to improve noise performance. Finally, extreme dynamic range problems exist when filters with very low frequency passbands are used. The article in the Jan. 1989 Journal of the Audio Engineering Society provides a summary of the current state of the art.

The state of the art in dynamic audio filtering, in which the coefficients are to be changing in time, is even more primitive. Coefficients are typically linearly interpolated, producing filters whose characteristics typically vary dramatically in audio quality over the sweep range from the desired swept response. The coefficients are linearly encoded in the classical IIR filter forms, preventing any logarithmic or audibly meaningful sweep, and requiring long words of typically 24 bits for adequate low frequency resolution. Furthermore, any dynamic sweeping requires computation of the increment required to be added each sample time. This complicates control of the filter during complicated sweeps, and makes it impossible to change the sweep trajectory of the filter mid-sweep without reading back the current sweep location.

SUMMARY OF THE INVENTION

It is an object of the present invention to provide an improved dynamic digital IIR audio filter and method.

It is another object of the present invention to remedy the major problems in state of the art digital IIR filtering and dynamic digital filtering for audio. In particular, the required multiplier coefficient size is reduced, such that 16-bit coefficients are adequate for good frequency resolution. In addition, the data size of the multiplier is also reduced to be similar to the input and output data resolution without inferior noise performance. Furthermore, the structure is easily modified to allow the fixing of the DC gain of the IIR filter to unity regardless of coefficient choice, eliminating any problems with filter dynamic range at low frequency passbands.

Additionally, a dynamic filter structure is disclosed which allows logarithmic filter sweeps, and compresses the coefficients further down to as few as 8 bits with adequate resolution for audio throughout the band.

Finally, a structure is disclosed which allows the alteration of sweep of the filter without excessive computation or the requirement to read the current sweep value.

All of these objectives can be accomplished by the present invention while allowing implementation of up to 128th order filtering on a single silicon integrated circuit.

Additional objects, advantages and novel features of the present invention will be set forth in part in the description which follows and in part become apparent to those skilled in the art upon examination of the following or ay be learned by practice of the invention. The objects and advantages of the invention may be realized and attained by means of the instrumentalities and combinations which are pointed out in the appended claims.

BRIEF DESCRIPTION OF THE DRAWINGS

The accompanying drawings which are incorporated in and form a part of this specification illustrate an embodiment of the invention and, together with the description, serve to explain the principles of the invention.

FIGS. 12A and 12B show the logic diagram of a portion of FIG. 11

DETAILED DESCRIPTION OF THE PREFERRED EMBODIMENT

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

The classical filter equation for a second order IIR digital filter is $$Y_n = X_n - B1*Y_{n-1} - B2*Y_{n-2}$$

Figure 1:
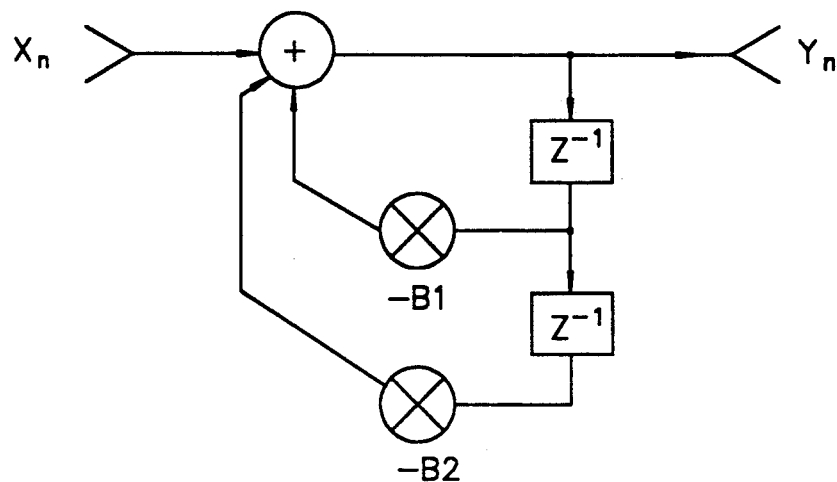
FIG. 1 depicts a diagram of a prior art digital filter structure.
Figure 2:
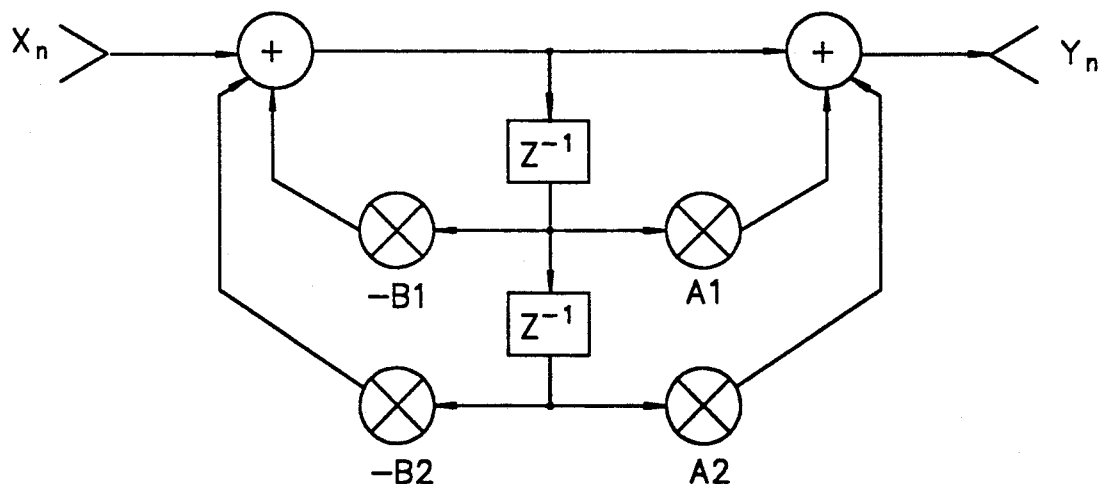
FIG. 2 depicts another diagram of a prior art digital filter structure.

B1 and B2 form complex conjugate poles at locations:

$$R = \text{sqrt}(B2) \quad \text{theta} = \arccos(-B1/2R)$$

where R is the radius of the pole location and theta is the angle, with zero coresponding to zero frequency and pi coresponding to half the sampling rate or approximately 20 kHz. A classical filter structure to directly implement this equation is shown in FIG. 1. Additionally, a second order FIR stage can be added to produce zeros to complete the classical structure as shown in FIG. 2.

The audio spectrum spans frequencies from 20 Hz to 20 kHz, and is typically logarithmically divided into ten octaves by the ear. The ear's sensitivity to loudness is similarly logarithmic and is approximately a range of 100 decibels (dB), where a decibel is defined as $$20 * \log 10(E/E\text{ref})$$

where E is the signal level and Eref is a reference level.

It is easily seen that the magnitude response of a resonance in a filter produced by a pole is proportional to the difference between the pole's radius and unity. Hence the ear's sensitivity to the position of the pole is tremendously amplified as the pole's radius approaches unity. Hence it would be desirable to develop a filter whose coefficients were proportional to the distance between the pole's radius and unity.

Through a similar argument, emphasizing instead the ear's logarithmic frequency sensitivity, it can be shown that the desirable coefficient relationship for the angle of poles should be such that small numbers represent very small angles, whose cosines approach unity.

Figure 3:
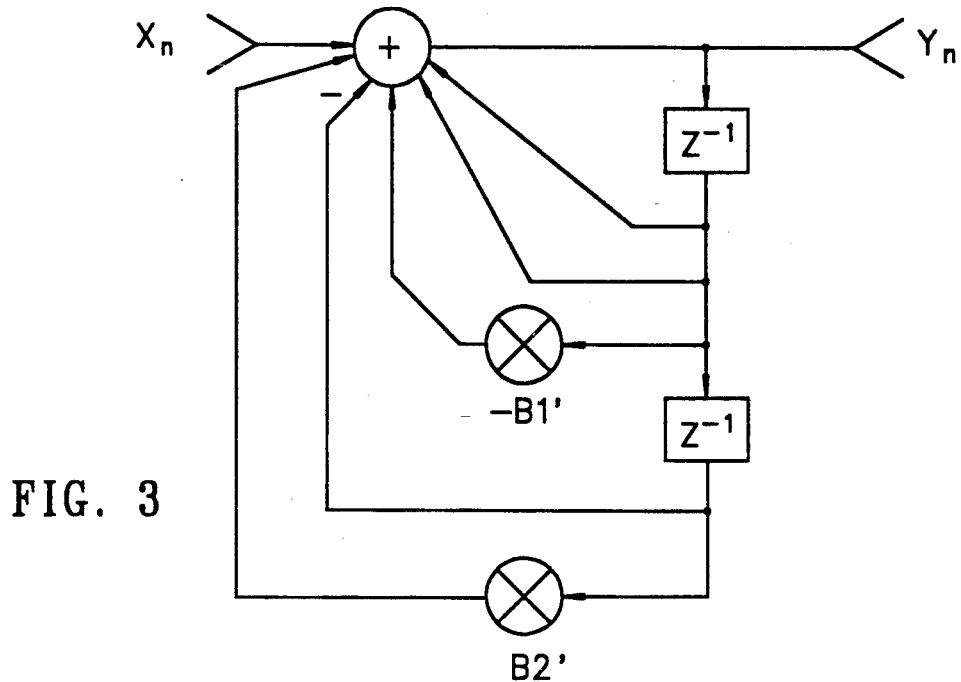
FIG. 3 depicts a diagram of an improved digital filter structure according to the present invention.

If one examines the flow graph of an IIR filter from a noise point of view, one will observe that the quantization of the signal at the input to the multiplier is the source of quantization noise. Reduction in the required truncation at the multiplier input will reduce the noise produced by the filter. It is easily observed that IIR filters become noisier as their poles tend towards unit radius and towards very low or very high frequencies. This can be explained by realizing that in these cases, the recursion within the filter is more severe, hence increasing the adverse effect of the multiplier input truncation noise. If the filter structure can be altered such that in these cases there is less effective quantization noise, improved performance in these interesting cases will result. A filter structure which accomplishes the above structural requirements according to the present invention is shown in FIG. 3, and the extension to add FIR terms in FIG. 4. Note that the coefficients have been modified as per the requirements:

$$B1' = B1 + 2$$

$$B2' = 1 - B2$$

and hence all coefficients are always positive, and the multiplies unsigned.

Figure 4:
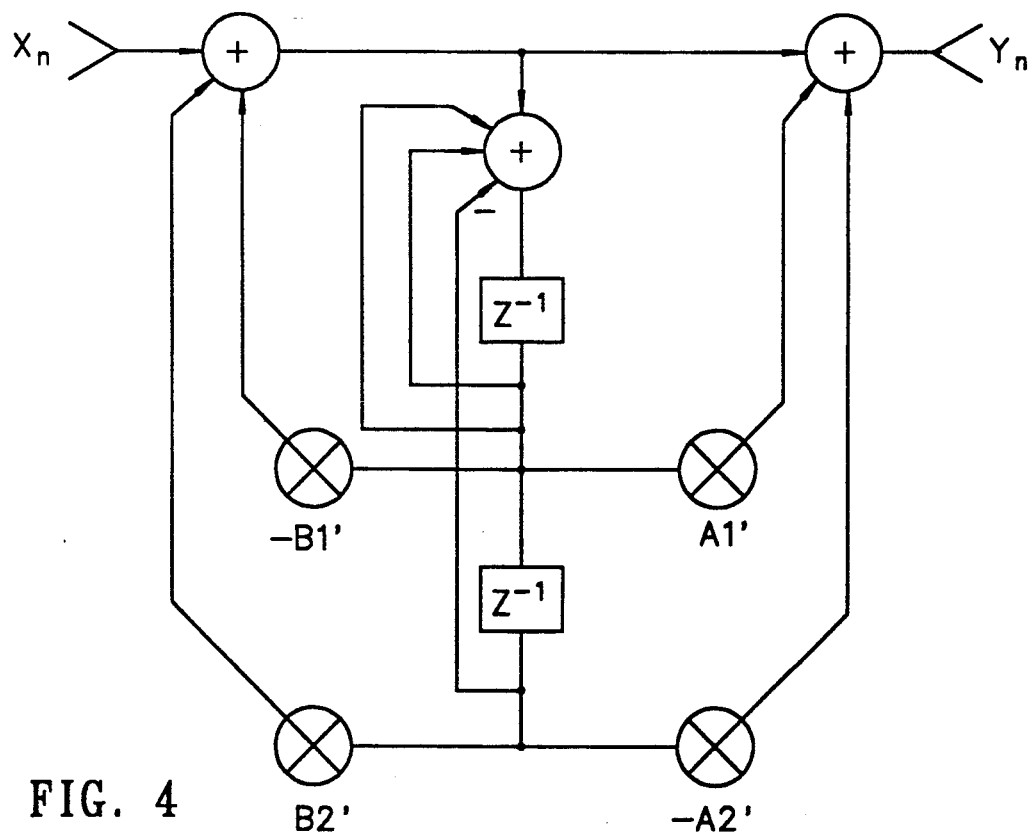
FIG. 4 depicts a diagram of another embodiment of a digital filter structure according to the present invention.
Figure 5:
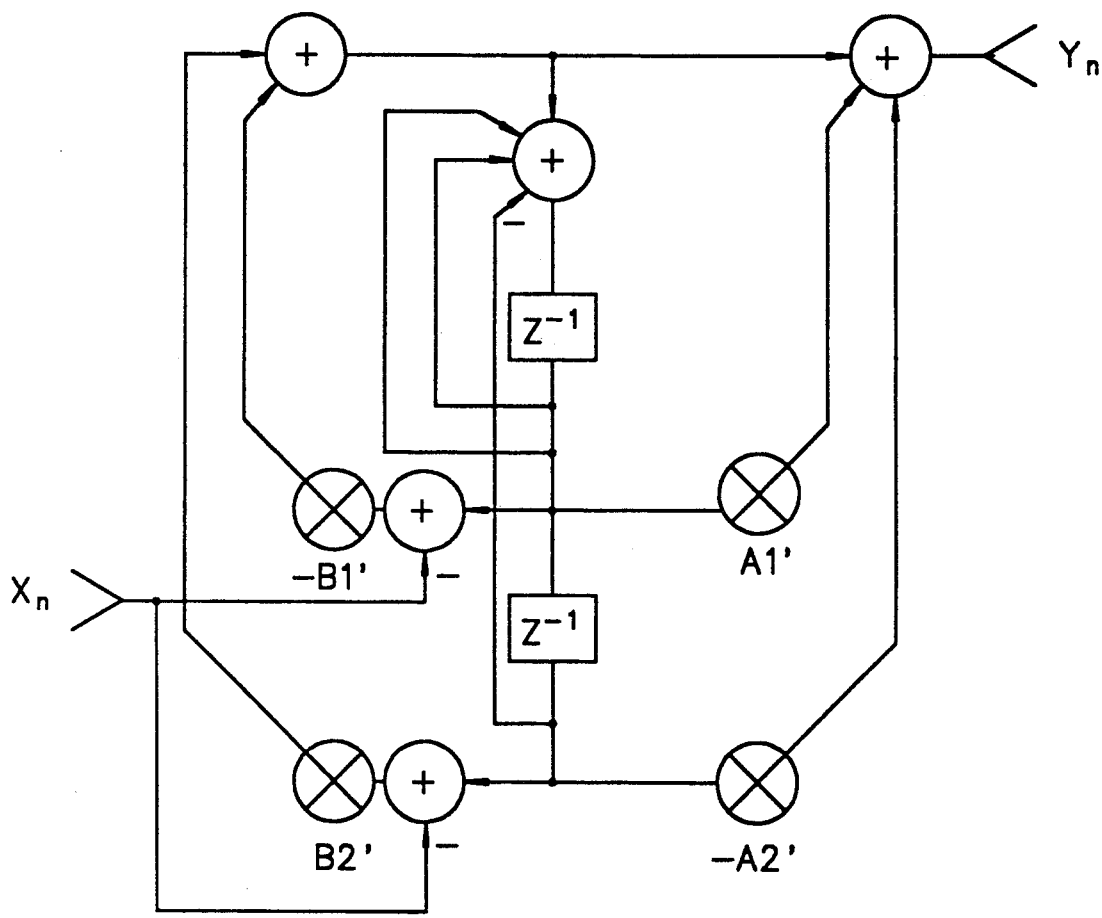
FIG. 5 depicts a further feature of the digital filter according to the present invention.

Another desirable feature for audio filters, in keeping with the objects of the invention, is to force the gain of the filter at zero frequency to be unity. This feature can be accomplished by the structure in FIG. 5. Note that the structures in FIGS. 4 and 5 are easily switched between.

Figure 6:
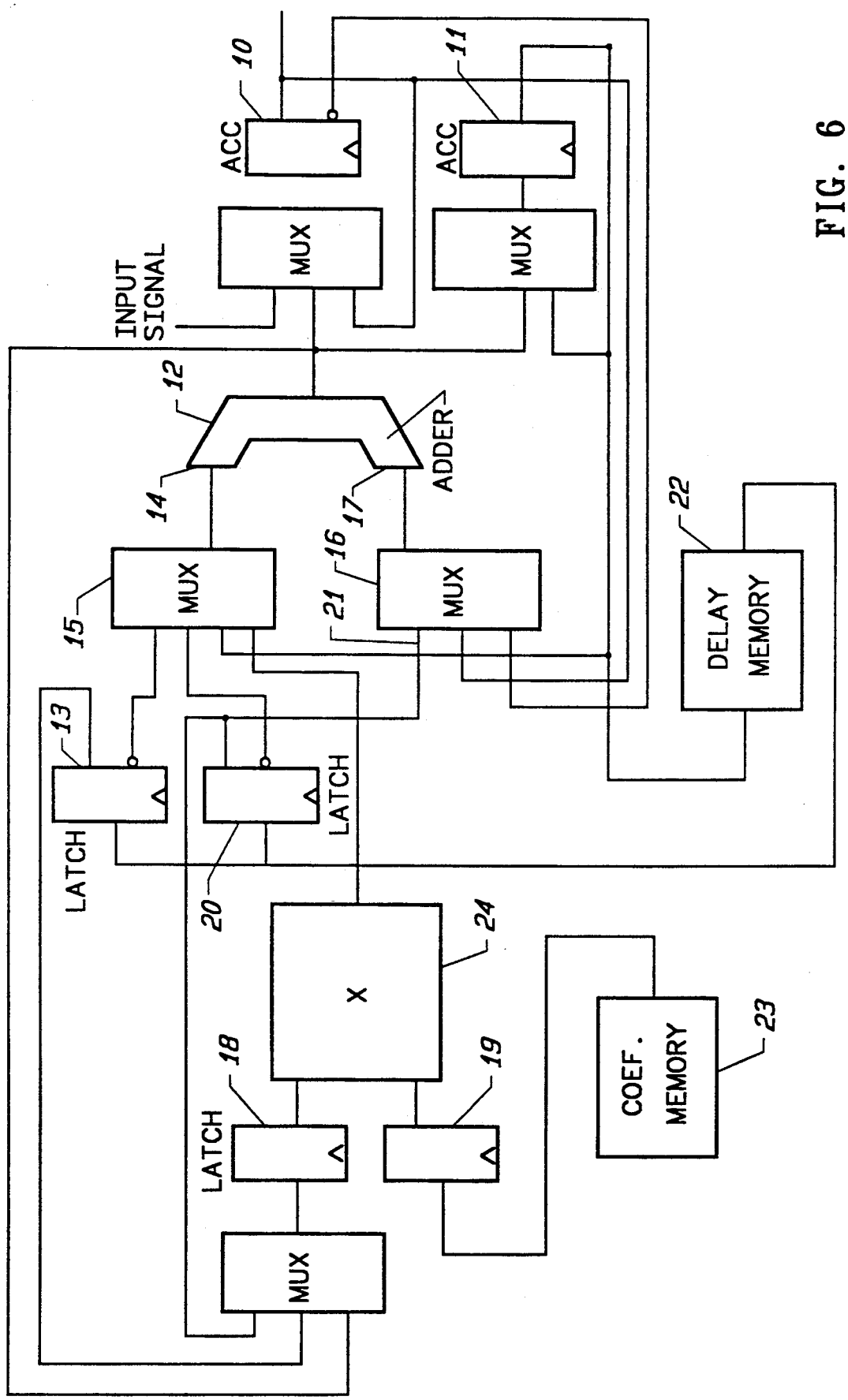
FIG. 6 depicts an implementation of the improved dynamic digital audio filter according to the present invention.
Figure 7:
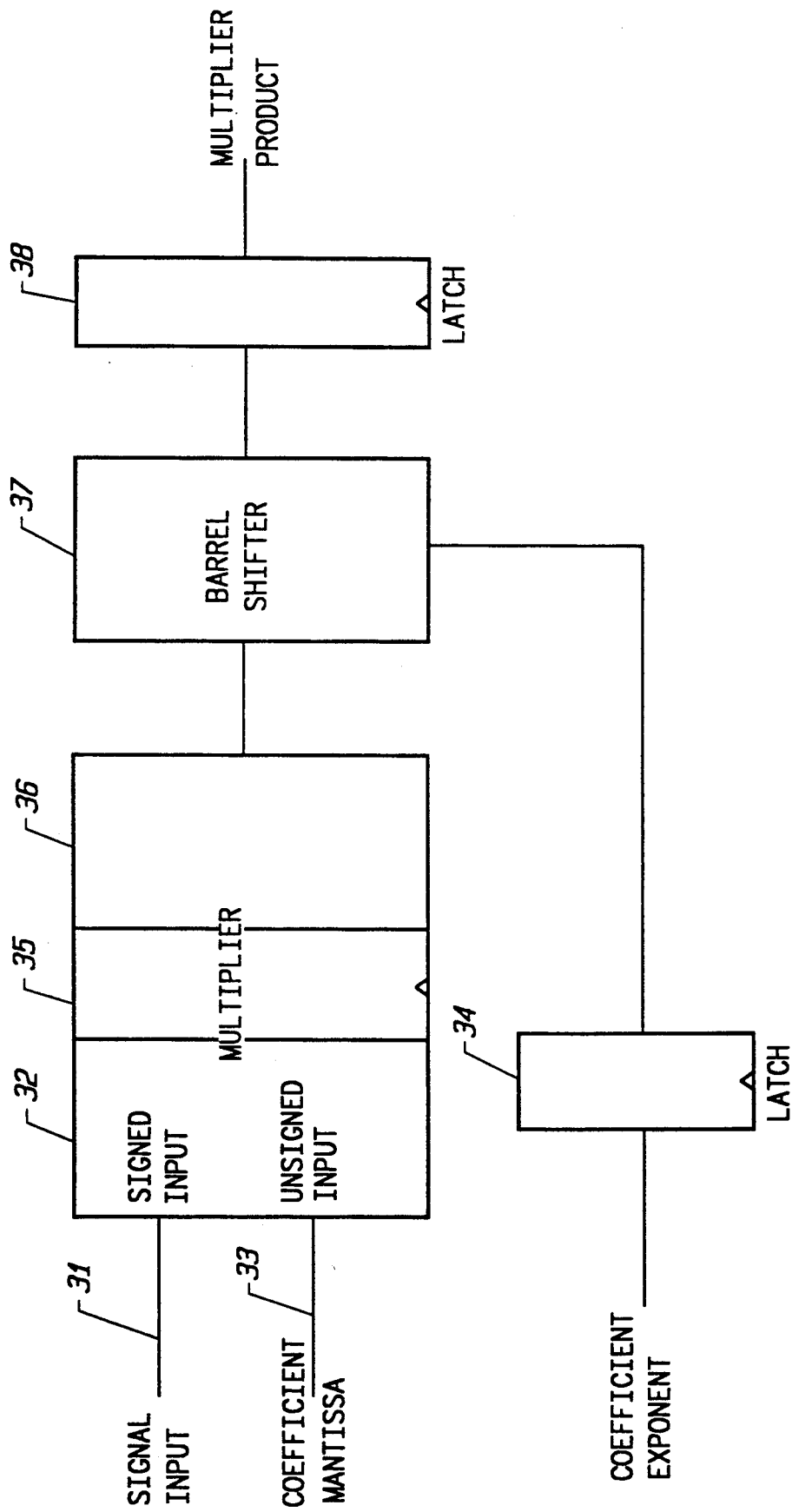
FIG. 7 depicts a diagram of a multiplier block which forms a portion of FIG. 6.

One implementation of the filter according to the present invention is shown in FIG. 6. In one preferred embodiment, a total of four multiplies and eight additions are used. As will later be discussed, this allows four multiplies to be used for interpolation of coefficients in dynamic filtering if the adder and multiplier have the same speed, which is typically the case using modern VLSI components.

In FIG. 6, accumulator 10 is used to accumulate the output signal. Auxilliary accumulator 11 accumulates the value to be saved in the delay memory 22. The filter operates in eight states. At the beginning of the cycle, accumulator 10 is loaded with the input signal.

During the first cycle, the adder 12 is supplied with negative delay memory 2's data from latch 13 at input 14 via multiplexer 15, and at input 17 the input signal from accumulator 10, or zero, depending on the DC gain stabilization desired, through multiplexer 16. The sum is latched into the multiplier input latch 18 to be multiplied by the associated unsigned coefficient B2' from coefficient memory 23, the output of which will simultaneously be loaded into multiplier input latch 19.

During the next cycle, negative delay memory 1's data from latch 20 is similarly routed to adder input 14, while input 17 stays the same. The sum is latched again in multiplier input latch 18 for multiplication by unsigned coefficient B1'.

During the third cycle, adder input 14 is switched back to negative delay memory 2's data, while adder input 17 is changed by multiplexer 16 to signal 21, which is positive delay memory 1's value shifted left one bit to form twice delay memory 1's value. The resulting sum is stored at the end of the cycle in auxilliary accumulator 11.

During the fourth cycle, the output of the multiplier 24 is routed to added input 14. This now is the product resulting from coefficient B2'. Adder input 17 will be selected as either negative the input signal as routed from accumulator 10, or zero, depending on the DC gain stabilitzation requirement. The resulting sum is latched into accumulator 10.

During the fifth cycle, the output of the multiplier 24, containing the product resulting from coefficient B1', is routed to adder input 10. The negative of the contents of accumulator 10 is routed to adder input 17. The resulting sum is stored in accumulator 10.

During the sixth cycle, the contents of accumulator 11 is routed to adder input 14, and of accumulator 10 to input 17. The resulting sum is saved in accumulator 11 to be stored in delay memory 22.

During the seventh cycle, the multiplier output, which is the product resulting from coefficient A2', is routed to adder input 14, and the negative of accumulator 10 routed to input 17. The resulting sum is stored in accumulator 10.

During the eighth and final cycle, the multiplier output, which is the product resulting from coefficient A1', is routed to the adder input 14, and the negative of the signal accumulator is routed to input 17. The resulting sum, which is the filter output and hence the input to the next stage, is stored in accumulator 10.

The reservation table for the above pipeline described in conjunction with FIG. 6 is presented below.

RESERVATION TABLE

| Adder Input 14 | Adder Input 17 | Adder CD | Result | A 10 contents | A 11 contents | Prod |
|---|---|---|---|---|---|---|
| $Z_2'$ | $(SA = X_n)$ & DC | 1 | $DC \& X_n - Z_2$ | $X_n$ | xx | xx |
| $Z_1'$ | $(SA = X_n)$ & DC | 1 | $DC \& X_n - Z_1$ | $X_n$ | xx | xx |
| $Z_2'$ | $2Z_1$ | 1 | $2Z_1 - Z_2$ | $X_n$ | xx | xx |
| $b_2'(DC \& X_n - Z_2)$ | $(SA = X_n')$ & IDC | IDC | $-AR2$ | $X_n$ | $2Z_1 - Z_2$ | $b2(DC \& X_n - X_2)$ |
| $b_1'(DC \& X_n - Z_1)$ | $SA = -AR2'$ | 1 | $b_1'(DC \& X_n - Z_1) + AR2$ | $-AR2$ | $2Z_1 - Z_2$ | $b_1(DC \& X_n - Z_1)$ |
| $2Z_1 - ZX_2$ | $SA = AR$ | 0 | $Y_n$ | AR | $2Z_1 - Z_2$ | $a_2'Z_2$ |
| $a_2'Z_2$ | $SA' = AR'$ | 1 | $a_2'Z_2 - AR$ | AR | $Y_n$ | $a_1'Z_1$ |
| $a_1'Z_1$ | $SA' = -MA1'$ | 1 | $MA1 + a_1'Z_1$ | $-MA1$ | $Y_n$ | xx |
| | | | $MA_{out} = X_n$ | | | |

$AR2 = IDC \& X_n - b_2'(DC \& X_n - X_2)$
$AR = IDC'X_n + b_1'(DC \& X_n - Z_1) + b_2'(Z_2 - DC \& X_n = AR2 + b_1'(DC \& X_n - Z_1)$
$Y_n = IDC'X_n - b_1'(Z_1 - DC \& X_n) + b_2'(Z_2 - DC \& X_n) + {_2}Z_1 - 2Z_2 = AR + {_2}Z_1 - 2Z_2$
$MA1 = IDC'X_n - b_1'(Z_2 - DC \& X_n) + b_2'(Z_2 - DC \& X_n) - a_2'Z_2 = AR - a_2'Z_2$
$MA_{out} = IDC'X_n - b_1'(Z_1 - DC \& X_n) + b_2'(Z_2 - DC \& X_n) + a_1'Z_1 - a_2'Z_2 = MA1 + a_1'Z_1$ Notes:
$Y_n$ must be positive, hence XL must be positive $2Z_1 - Z_2$ or dodi must be complemented, dodi cannot always be complemented as both senses of product area required for MA portion and we cannot add two complements as a carry in of 2 is required. Hence, $Z_2$ must be complemented, therefore $Z_1$ should be complemented. We conclude that the B multiplies will be negative Z data.

Figure 8:
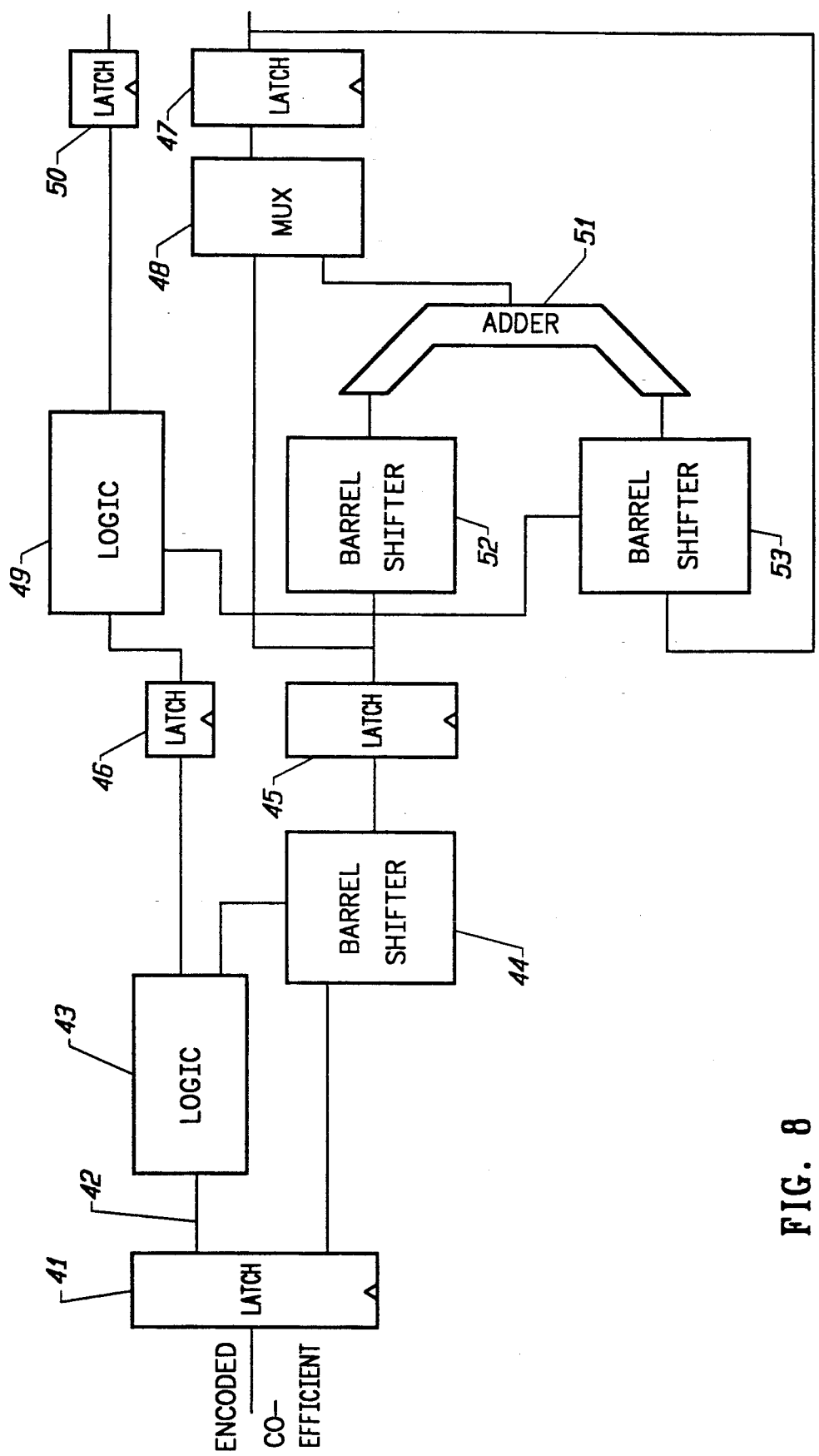
FIG. 8 depicts a diagram of a decoding technique which forms a part of the present invention.

It should be noted that the multiplier 24 of FIG. 6 uses block floating point techniques on the coefficients 20 to achieve a greater range. The details of the multiplier block are illustrated in FIG. 8. The signal is applied to the signed input 31 of the multiplier input stage 32 (which consists of the Booth's recoders and wallace trees), and the coefficient mantissa is applied to the unsigned input 33. The coefficient exponent is applied to the exponent pipeline latch 34, which is required due to the multiplier pipeline latch 35 which feeds the second stage 36 of the multiplier consisting of the final lookahead carry adder. This in turn feeds barrel shifter 37, which adjusts for the previous coefficient's exponent. The final product, correctly scaled, is stored in product latch 38.

In accordance with the objects of the current invention, logarithmic interpolation of the coefficients is required to produce audibly meaningful sweeps. This is accomplished not through true logarithmic interpolation, but rather through linear interpolation of approximately logarithmically encoded coefficients.

The poles of the filter are assumed to be, for important cases, near zero frequency and near unity radius. Hence, $B2' = 1 - B2 = 1 - R2 = 1 - (1 - 2d + d2)$ if $R = 1 - d$. Since R is close to 1, d is small and d2 is very small, so B2' is approximately 2d, and hence proportional to the distance from the pole to the unit circle. Consequently a nominally logarithmic coding for B2' will be an audibly meaningful coding.

Similarly, if the poles angle t is near zero, cos(t) will be approximately $1 - t2$, hence $B1' = 2 + B1 = 2 - 2R\cos(t) = 2 - 2(1-d)(1-t2) = 2d + 2 - (1-d)t2$ which is approximately $B2' + 2t2$. One can thus logarithmically encode the difference between B1' and B2' and accomplish the objective of approximating logarithmic frequency and resonance control.

The actual decoding can be accomplished by means of either a ROM or a shifting technique. The latter is demonstrated in FIG. 9.

Figure 9:
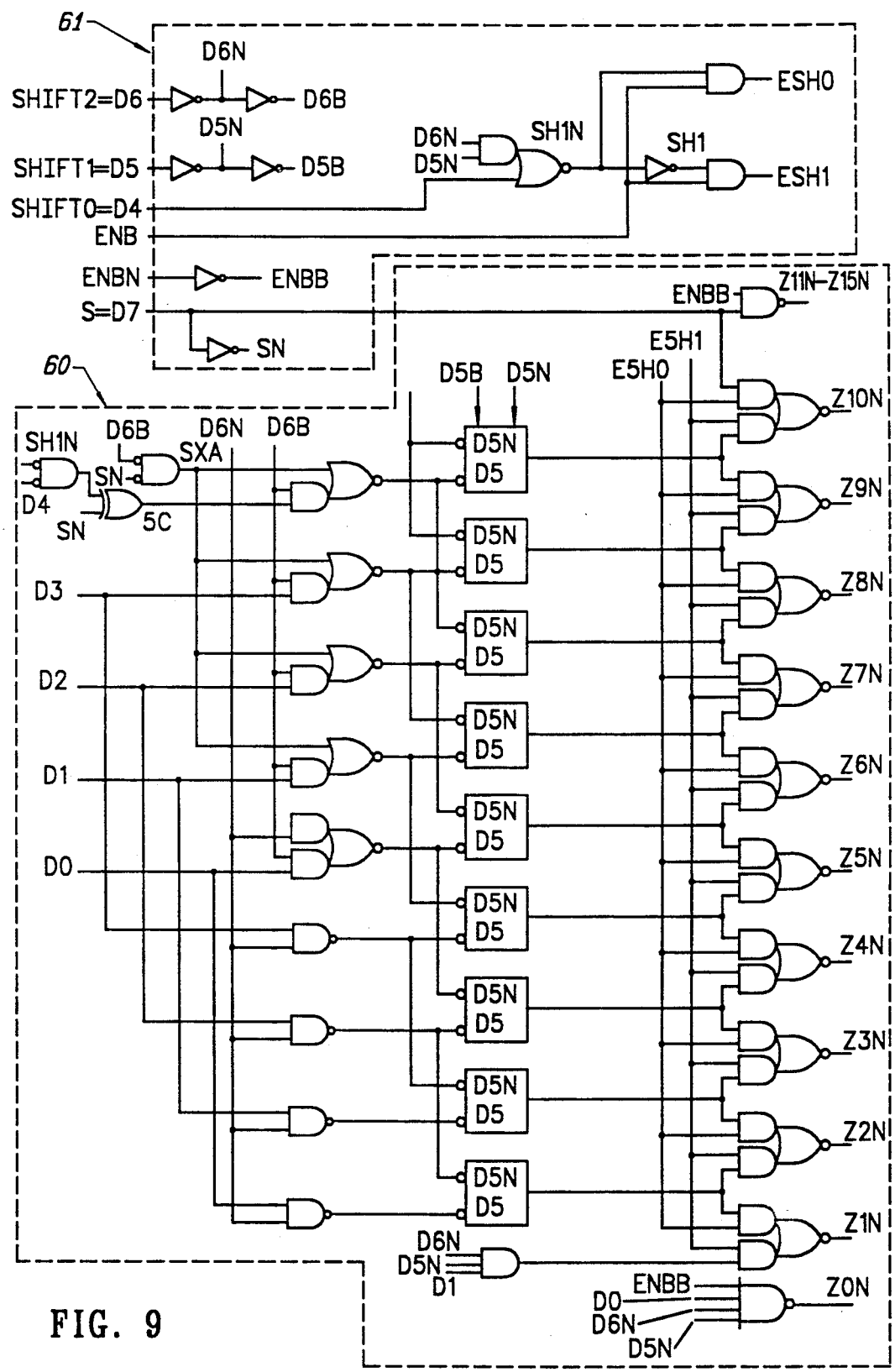
FIG. 9 depicts a preferred embodiment of the present invention.

In FIG. 9, the coefficient to be decoded is held in coefficient latch 41. In the case of a static filter, this would be supplied from a memory holding the coefficients; in the case of a dynamic filter, this would be the output of the coefficient math unit, which would add the lower coefficient to the product of the interpolating variable times the coefficient differences. The most significant bits 42, (in this case 4 bits are used), are routed through the shift decoding logic 43, to determine the degree of shift in the barrel shifter 44. The resulting decoded coefficient is stored in latch 45. If block floating point coefficients are used, the shift logic can additionally or alternatively output an exponent into exponent latch 46. If the coefficient is a second coefficient (B2' or A2'), the result is directly passed to the final output latch 47 through multiplexer 48, and exponent control logic 49 passes the exponent unchanged into exponent output latch 50 if block floating point is used.

If the coefficient is a first coefficient (which must be processed second), then adder 51 adds the previously computed second coefficient as stored in 47 to the decoded difference in latch 45, and the result passes through multiplexer 48 into the output latch. If block floating point is used, the exponent logic 49 must control barrel shifters 52 and 53 to normalize the addition.

The coefficients are interpolated according to the formula $C(x) = Ca + x(Cb - Ca)$, where x varies from zero to unity. This requires one multiply per coefficient, and with two coefficients each for poles and zeros one can use the available four multipliers to make complete use of the required hardware in a time division multiplexed system.

The interpolating variable x is updated in the known manner of incrementing its value each sample period, and clamping the result to a final known value when the clamp value is exceeded. This works well when both the increment and clamp are computed externally as the dynamic sweep rate and destination. However, this method fails when a slow controlling processor is generating the sweep variables, and a real time command requires the change to a new destination using a sweep while the current sweep is in progress. In this case, the slower processor must calculate new new sweep increment based on the current value of the interpolating variable x and the destination value. Unfortunately, the interpolating variable x continues to be incremented according to the old sweep while the slow processor calculates its result, with an inaccurate (or even worse, the wrong signed) increment saved when the computation is done.

The solution to this problem is another aspect of the present invention. Rather than supplying the interpolating hardware with both a destination and increment, the interpolator is supplied with a destination and an approach time in samples. The interpolator computes within a single sample period the difference between the destination and current value, divides this by the time, and stores the result in the increment.

Figure 10:
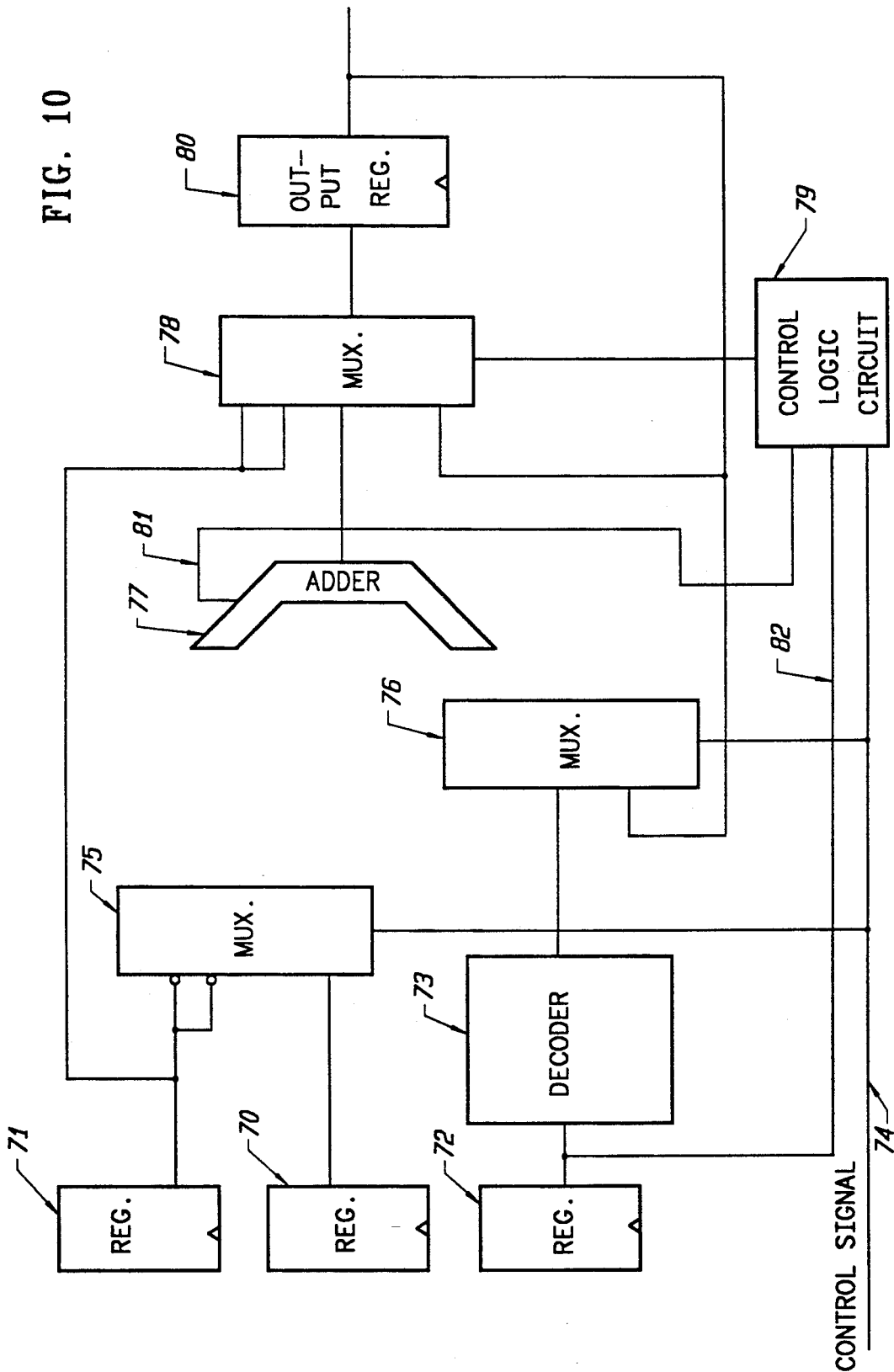
FIG. 10 depicts logic used to update an interpolating variable.

The preferred embodiment of this solution will now be described. The increment is stored in a compressed value as indicated in Table I. The 8-bit value S, shift2, shift1, shift0, d3, d2, d1, d0 is translated into a signed 16-bit linear value from −20408 to 2047, using the logic circuitry shown in FIG. 10. Sign bit S and data bits d3, d2, d1 and d0 are shifted in a sign-extended matter by barrel shifter 60. The control of the shifter is performed by logic 61 to conform to the translation defined in Table I below.

the incremented current value is less than the clamp. If the incremented current value exceeds the clamp, or if overlow occurred during phase 1, then logic 79 causes multiplexer 78 to select the 16-bit clamp value; otherwise the incremented current value is selected. At the end of the second phase, register 80 contains the properly computed new current value.

Figure 12B:
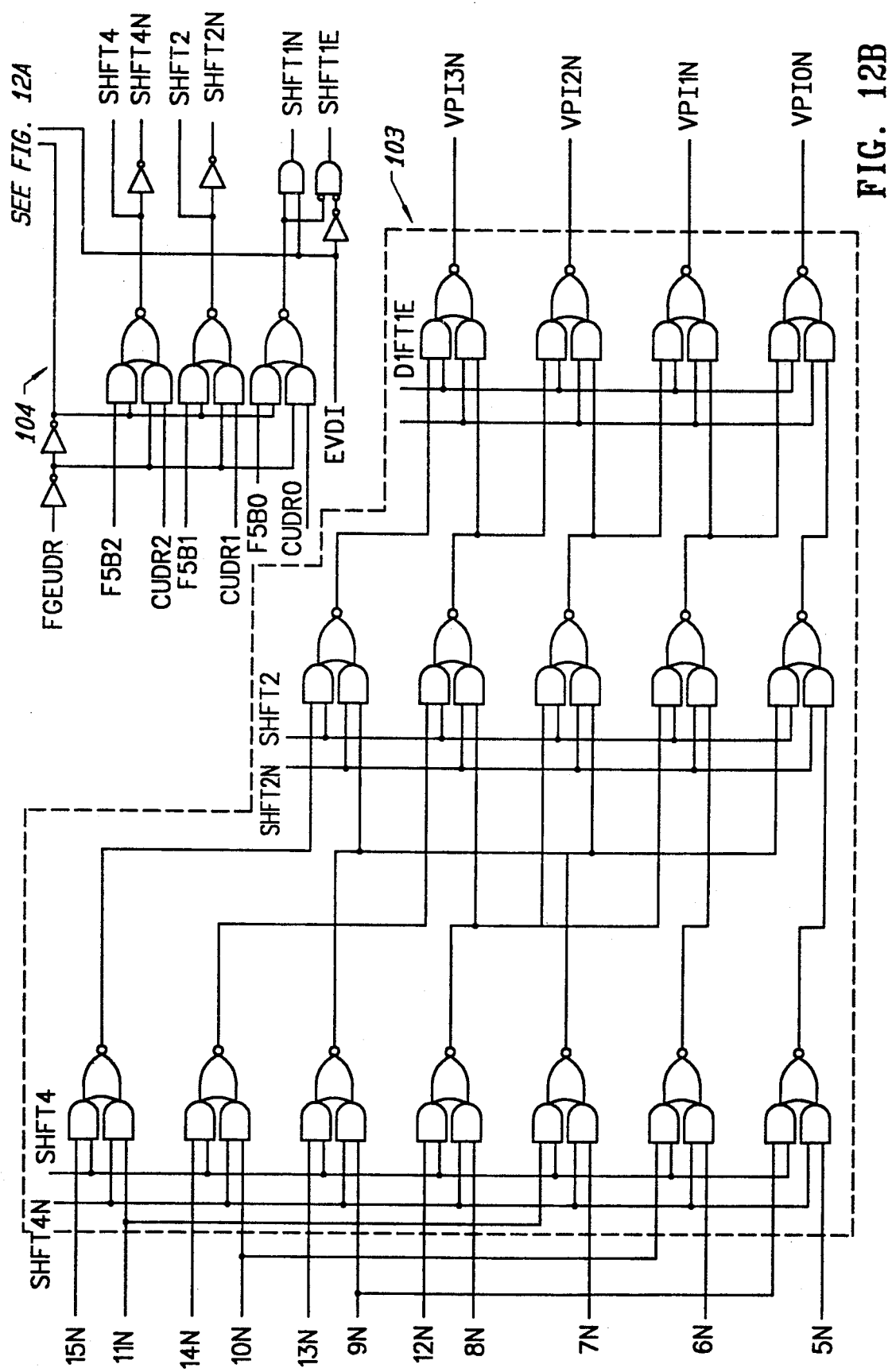

FIG. 12 illustrates the circuitry required to implement the automatic computation of the required encoded 8-bit increment, based on a destination (clamp)

TABLE I

| 16bitl F | d15 | d14 | d13 | d12 | d11 | d10 | d9 | d8 | d7 | d6 | d5 | d4 | d3 | d2 | d1 | d0 | shift |
|---|---|---|---|---|---|---|---|---|---|---|---|---|---|---|---|---|---|
| 7 | S | S | S | S | S | S* | d3 | d2 | d1 | d0 | 0 | 0 | 0 | 0 | 0 | 0 | 0 |
| 6 | S | S | S | S | S | S  | S* | d3 | d2 | d1 | d0 | 0 | 0 | 0 | 0 | 0 | 1 |
| 5 | S | S | S | S | S | S  | S  | S* | d3 | d2 | d1 | d0 | 0 | 0 | 0 | 0 | 2 |
| 4 | S | S | S | S | S | S  | S  | S  | S* | d3 | d2 | d1 | d0 | 0 | 0 | 0 | 3 |
| 3 | S | S | S | S | S | S  | S  | S  | S  | S* | d3 | d2 | d1 | d0 | 0 | 0 | 4 |
| 2 | S | S | S | S | S | S  | S  | S  | S  | S  | S* | d3 | d2 | d1 | d0 | 0 | 5 |
| 1 | S | S | S | S | S | S  | S  | S  | S  | S  | S  | S* | d3 | d2 | d1 | d0 | 6 |
| 0 | S | S | S | S | S | S  | S  | S  | S  | S  | S  | S  | d3 | d2 | d1 | d0 | 6 |

NOTE:
Adder carry is set for increment add during positive increments. This means that a zero increment cannot be reached (instead, set target to correct value), and that the increment ranges for positive and negative are the same (0001-07c1 = ffff − f83f). This simplifies automatic decoding from target-value, as zero cannot be reached on underflow.

Figure 11:
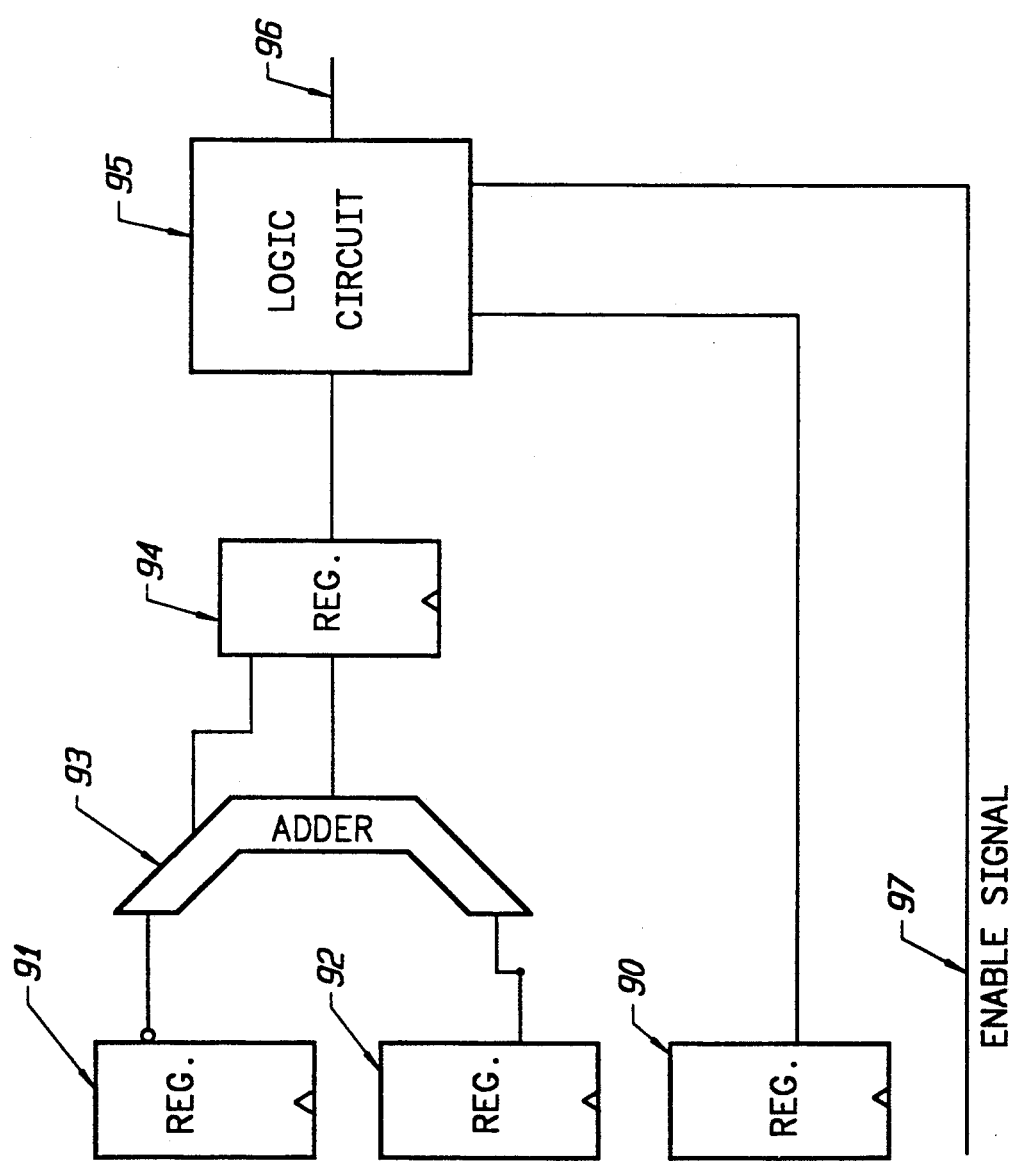
FIG. 11 illustrates circuitry used to implement automatic computation of an encoded increment according to the present invention.

The clamp value is similarly an 8-bit value, which is translated into a 16-bit linear value by simply duplicating the bits twice. For example, 5a hexidecimal would translate to 5a5a hexidecimal. FIG. 11 illustrates the logic used to add update the 16-bit interpolating variable using the 8-bit increment and clamp.

In FIG. 11, register 70 holds the current value of the 16-bit interpolating variable. Register 71 holds the 8-bit clamp value, and register 72 holds the 8-bit encoded increment value. Decoder 73 decodes the 8-bit increment into a 16-bit signed linear value. Signal 74 controls the two phases of the operation. In the first phase, multiplexers 75 and 76 select as the inputs to the added 77 the current value and linear increment, and multiplexer 78 is controlled by logic unit 79 so that the incremented current value appears in output register 80. Logic 79 also notes the state of the adder carry signal 81 with respect to the increment sign bit 82, such that an arithmetic overflow can be detected during this phase. In the second phase, multiplexers 75 and 76 select the inverted clamp value and incremented current value respectively, and hence adder 77 determines the difference between these values. The state of adder carry signal 81 and increment sign bit 82 now allows control logic 79 to determine if the incremented current value has exceeded the current value; that is, if the increment sign is positive and the incremented current value is greater than the clamp, or if the increment sign is negative and value, current value and approach time. The approach time is selected from eight possible values, each a power or two greater, with the lowest being 32 sample periods. This approach time is stored in register 90. The current value of the interpolator is stored in register 91, and the destination is stored in register 92. Adder 93 computes the difference between the destination and current value, which is then stored in register 94. Logic 95 computes the required increment to reach the destination in approach time samples. The 8-bit value is output on signal lines 96 when enable signal 97 is active.

FIG. 13 shows the detailed logic with block 95. Logic 100 determines the first set bit, that is, the first bit different from the sign bit. Logic 101 determines the shift bits of the required increment based on the first set bit and the selected approach time indicated by CUDR2N, CUDR1N and CUDR0N. Signal 102 indicates that the first set bit is greater than or equal to the selected approach time, which determines the function of data bit barrel shifter 103. If the first set bit is greater than or equal to the selected approach time, the first set bit determines the shifting of the data bits. Otherwise, the selected approach time determines the shifting of the bits. Enable signal 104 simply allows the value to be driven onto the circuit outputs. When the enable is invalid, all outputs are logical 1's. Table II below illustrates the resulting outputs as a function of the difference input and the selected approach time.

TABLE II

| ARMAdillo Interpolator Increment Decoding: | | | | | | | | | |
|---|---|---|---|---|---|---|---|---|---|
| Difference | Binary | FSB | @ .6 | @ 1.2 | @ 2.4 | @ 4.8 | @ 9.6 | @ 20 | @ 40 | @ 80 |
| 0fff-0f800 | 011111xxxxxxxxxxx | 15 | 7f | 6f | 5f | 4f | 3f | 2f | 1f | 0f |
| 0f7ff-0f000 | 011110xxxxxxxxxxx | 15 | 7e | 6e | 5e | 4e | 3e | 2e | 1e | 0f |
| 0efff-0e800 | 011101xxxxxxxxxxx | 15 | 7d | 6d | 5d | 4d | 3d | 2d | 1d | 0e |
| 087ff-08000 | 010000xxxxxxxxxxx | 15 | 70 | 60 | 50 | 40 | 30 | 20 | 10 | 08 |
| 07fff-07c00 | 0011111xxxxxxxxxx | 14 | 6f | 5f | 4f | 3f | 2f | 1f | 0f | 07 |
| 07bff-07800 | 0011110xxxxxxxxxx | 14 | 6e | 5e | 4e | 3e | 2e | 1e | 0f | 07 |
| 077ff-07400 | 0011101xxxxxxxxxx | 14 | 6d | 5d | 4d | 3d | 2d | 1d | 0e | 07 |
| 043ff-04000 | 0010000xxxxxxxxxx | 14 | 60 | 50 | 40 | 30 | 20 | 10 | 08 | 04 |
| 03fff-03e00 | 00011111xxxxxxxxx | 13 | 5f | 4f | 3f | 2f | 1f | 0f | 07 | 03 |
| 03dff-03c00 | 00011110xxxxxxxxx | 13 | 5e | 4e | 3e | 2e | 1e | 0f | 07 | 03 |
| 021ff-02000 | 00010000xxxxxxxxx | 13 | 50 | 40 | 30 | 20 | 10 | 08 | 04 | 02 |
| 01fff-01f00 | 000011111xxxxxxxx | 12 | 4f | 3f | 2f | 1f | 0f | 07 | 03 | 01 |
| 01eff-01e00 | 000011110xxxxxxxx | 12 | 4e | 3e | 2e | 1e | 0f | 07 | 03 | 01 |
| 010ff-01000 | 000010000xxxxxxxx | 12 | 40 | 30 | 20 | 10 | 08 | 04 | 02 | 01 |
| 00fff-00f80 | 0000011111xxxxxxx | 11 | 3f | 2f | 1f | 0f | 07 | 03 | 01 | 00 |

TABLE II-continued

ARMAdillo Interpolator Increment Decoding:

| Difference | Binary | FSB | @ .6 | @ 1.2 | @ 2.4 | @ 4.8 | @ 9.6 | @ 20 | @ 40 | @ 80 |
|---|---|---|---|---|---|---|---|---|---|---|
| 00f7f-00f00 | 0000011110xxxxxx | 11 | 3e | 2e | 1e | 0f | 07 | 03 | 01 | 00 |
| 0087f-00800 | 0000010000xxxxxx | 11 | 30 | 20 | 10 | 08 | 04 | 02 | 01 | 00 |
| 007ff-007c0 | 00000011111xxxxx | 10 | 2f | 1f | 0f | 07 | 03 | 01 | 00 | 00 |
| 007bf-00780 | 00000011110xxxxx | 10 | 2e | 1e | 0f | 07 | 03 | 01 | 00 | 00 |
| 0077f-00740 | 00000011101xxxxx | 10 | 2d | 1d | 0e | 07 | 03 | 01 | 00 | 00 |
| 0073f-00700 | 00000011100xxxxx | 10 | 2c | 1c | 0e | 07 | 03 | 01 | 00 | 00 |
| 006ff-006c0 | 00000011011xxxxx | 10 | 2b | 1b | 0d | 06 | 03 | 01 | 00 | 00 |
| 006bf-00680 | 00000011010xxxxx | 10 | 2a | 1a | 0d | 06 | 03 | 01 | 00 | 00 |
| 0067f-00640 | 00000011001xxxxx | 10 | 29 | 19 | 0c | 06 | 03 | 01 | 00 | 00 |
| 0063f-00600 | 00000011000xxxxx | 10 | 28 | 18 | 0c | 06 | 03 | 01 | 00 | 00 |
| 005ff-005c0 | 00000010111xxxxx | 10 | 27 | 17 | 0b | 05 | 02 | 01 | 00 | 00 |
| 005bf-00580 | 00000010110xxxxx | 10 | 26 | 16 | 0b | 05 | 02 | 01 | 00 | 00 |
| 0057f-00540 | 00000010101xxxxx | 10 | 25 | 15 | 0a | 05 | 02 | 01 | 00 | 00 |
| 0053f-00500 | 00000010100xxxxx | 10 | 24 | 14 | 0a | 05 | 02 | 01 | 00 | 00 |
| 004ff-004c0 | 00000010011xxxxx | 10 | 23 | 13 | 09 | 04 | 02 | 01 | 00 | 00 |
| 004bf-00480 | 00000010010xxxxx | 10 | 22 | 12 | 09 | 04 | 02 | 01 | 00 | 00 |
| 0047f-00440 | 00000010001xxxxx | 10 | 21 | 11 | 08 | 04 | 02 | 01 | 00 | 00 |
| 0043f-00400 | 00000010000xxxxx | 10 | 20 | 10 | 08 | 04 | 02 | 01 | 00 | 00 |
| 003ff-003e0 | 000000111111xxxx | 9 | 1f | 0f | 07 | 03 | 01 | 00 | 00 | 00 |
| 0021f-00200 | 000000010000xxxx | 9 | 10 | 08 | 04 | 02 | 01 | 00 | 00 | 00 |
| 001ff-001e0 | 0000000011111xxx | 8 | 0f | 07 | 03 | 01 | 00 | 00 | 00 | 00 |
| 0011f-00100 | 0000000001000xxx | 8 | 08 | 04 | 02 | 01 | 00 | 00 | 00 | 00 |
| 000ff-000e0 | 00000000001111xx | <8 | 07 | 03 | 01 | 00 | 00 | 00 | 00 | 00 |
| 0001f-00000 | 00000000000000xx | <8 | 00 | 00 | 00 | 00 | 00 | 00 | 00 | 00 |
| 1000-107ff | 100000xxxxxxxxxx | 15 | f0 | e0 | d0 | c0 | b0 | a0 | 90 | 80 |
| 10800-10fff | 100001xxxxxxxxxx | 15 | f1 | e1 | d1 | c1 | b1 | a1 | 91 | 80 |
| 11000-117ff | 100010xxxxxxxxxx | 15 | f2 | e2 | d2 | c2 | b2 | a2 | 92 | 81 |
| 17800-17fff | 101111xxxxxxxxxx | 15 | ff | ef | df | cf | bf | af | 9f | 87 |
| 18000-183ff | 1100000xxxxxxxxx | 14 | e0 | d0 | c0 | b0 | a0 | 90 | 80 | 88 |
| 18400-187ff | 1100001xxxxxxxxx | 14 | e1 | d1 | c1 | b1 | a1 | 91 | 80 | 88 |
| 18800-18bff | 1100010xxxxxxxxx | 14 | e2 | d2 | c2 | b2 | a2 | 92 | 81 | 88 |
| 1bc00-1bfff | 1101111xxxxxxxxx | 14 | ef | df | cf | bf | af | 9f | 87 | 8b |
| 1c000-1c1ff | 11100000xxxxxxxx | 13 | d0 | c0 | b0 | a0 | 90 | 80 | 88 | 8c |
| 1c200-1c3ff | 11100001xxxxxxxx | 13 | d1 | c1 | b1 | a1 | 91 | 80 | 88 | 8c |
| 1deff-1dfff | 11101111xxxxxxxx | 13 | df | cf | bf | af | 9f | 87 | 8b | 8d |
| 1e000-1e0ff | 111100000xxxxxxx | 12 | c0 | b0 | a0 | 90 | 80 | 88 | 8c | 8e |
| 1e100-1e1ff | 111100001xxxxxxx | 12 | c1 | b1 | a1 | 91 | 80 | 88 | 8c | 8e |
| 1ef00-1efff | 111101111xxxxxxx | 12 | cf | bf | af | 9f | 87 | 8b | 8d | 8e |
| 1f000-1f07f | 1111100000xxxxxx | 11 | b0 | a0 | 90 | 80 | 88 | 8c | 8e | 8f |
| 1f800-1f0ff | 1111100001xxxxxx | 11 | b1 | a1 | 91 | 80 | 88 | 8c | 8e | 8f |
| 1f780-1f7ff | 1111101111xxxxxx | 11 | bf | af | 9f | 87 | 8b | 8d | 8e | 8f |
| 1f800-1f83f | 11111100000xxxxx | 10 | a0 | 90 | 80 | 88 | 8c | 8e | 8f | 8f |
| 1f840-1f87f | 11111100001xxxxx | 10 | a1 | 91 | 80 | 88 | 8c | 8e | 8f | 8f |
| 1f880-1f8bf | 11111100010xxxxx | 10 | a2 | 92 | 81 | 88 | 8c | 8e | 8f | 8f |
| 1f8c0-1f8ff | 11111100011xxxxx | 10 | a3 | 93 | 81 | 88 | 8c | 8e | 8f | 8f |
| 1f900-1f93f | 11111100100xxxxx | 10 | a4 | 94 | 82 | 89 | 8c | 8e | 8f | 8f |
| 1f940-1f97f | 11111100101xxxxx | 10 | a5 | 95 | 82 | 89 | 8c | 8e | 8f | 8f |
| 1f980-1f9bf | 11111100110xxxxx | 10 | a6 | 96 | 83 | 89 | 8c | 8e | 8f | 8f |
| 1f9c0-1f9ff | 11111100111xxxxx | 10 | a7 | 97 | 83 | 89 | 8c | 8e | 8f | 8f |
| 1fa00-1fa3f | 11111101000xxxxx | 10 | a8 | 98 | 84 | 8a | 8d | 8e | 8f | 8f |
| 1fa40-1fa7f | 11111101001xxxxx | 10 | a9 | 99 | 84 | 8a | 8d | 8e | 8f | 8f |
| 1fa80-1fabf | 11111101010xxxxx | 10 | aa | 9a | 85 | 8a | 8d | 8e | 8f | 8f |
| 1fac0-1faff | 11111101011xxxxx | 10 | ab | 9b | 85 | 8a | 8d | 8e | 8f | 8f |
| 1fb00-1fb3f | 11111101100xxxxx | 10 | ac | 9c | 86 | 8b | 8d | 8e | 8f | 8f |
| 1fb40-1fb7f | 11111101101xxxxx | 10 | ad | 9d | 86 | 8b | 8d | 8e | 8f | 8f |
| 1fb80-1fbbf | 11111101110xxxxx | 10 | ae | 9e | 87 | 8b | 8d | 8e | 8f | 8f |
| 1fbc0-1fbff | 11111101111xxxxx | 10 | af | 9f | 87 | 8b | 8d | 8e | 8f | 8f |
| 1fc00-1fc1f | 111111100000xxxx | 9 | 90 | 80 | 88 | 8c | 8e | 8f | 8f | 8f |
| 1fde0-1fdff | 111111101111xxxx | 9 | 9f | 87 | 8b | 8d | 8e | 8f | 8f | 8f |
| 1fe00-1fe1f | 1111111100000xxx | 8 | 80 | 88 | 8c | 8e | 8f | 8f | 8f | 8f |
| 1fee0-1feff | 1111111101111xxx | 8 | 87 | 8b | 8d | 8e | 8f | 8f | 8f | 8f |
| 1ff00-1ff1f | 11111111110000xx | <8 | 88 | 8c | 8e | 8f | 8f | 8f | 8f | 8f |
| 1ffe0-1ffff | 11111111111111xx | <8 | 8f | 8f | 8f | 8f | 8f | 8f | 8f | 8f |

The foregoing description of the preferred embodiment of the invention has been presented for purposes of illustration and description. It is not intended to be exhaustive or to limit the invention to the precise form disclosed, and many modifications and variations are possible in light of the above teaching. The preferred embodiment was chosen and described in order to best explain the principles of the invention and its practical applications to thereby enable others skilled in the art to best utilize the invention and various embodiments and with various modifications as are suited to the particular use contemplated. It is intended that the scope of the invention be defined only by the claims appended hereto.

What is claimed is:

1. A dynamic digital audio filter comprising
adding means for receiving an input audio signal,
first and second unit delay means connected to an output of said adding means for forming first and second unit output delays each having a first bit width, respectively, wherein the first unit delay is one time unit and wherein the second unit delay is two time units, means for providing a first unsigned coefficient and a second unsigned coefficient, unsigned multiplying means receiving said first and second output delays, wherein the inputs to said multiplying means are a truncation of said first and second output delays each having a truncated bit width such that the truncated bit width is less than said first bit width so as to form a first truncated delay and a second truncated delay, said unsigned multiplying means including means for providing said first unsigned coefficient times the first truncated delay and second unsigned coefficient times the second truncated delay, means for shifting the output of said first delay means to multiply by two, means for forming a 2's complement of the output of said second delay means, and said adding means including means for forming an output signal which is a sum of said input audio signal, the output of said first delay means shifted to multiply by two, the 2's complement output of said second delay means, the first unsigned coefficient times the first truncated delay, and the second unsigned coefficient times the second truncated delay.

2. A digital filter as in claim 1 including means for forming a difference between said first delay and said input audio signal and wherein said sum includes the first unsigned coefficient times the difference between said first delay and said input audio signal and including means for forming a difference between said second delay and said input audio signal and wherein said sum includes the second unsigned coefficient times the difference between said second delay and said input audio signal.

3. A digital filter as in claim 1 further including a finite impulse response filter.

4. A digital filter as in claim 1 including first storage means and wherein said second coefficient is stored in a logarithmically compressed format in said first storage means.

5. A digital filter as in claim 4 including second storage means and including a third coefficient stored in said second storage means in a logarithmically compressed format representative of a difference between said first and second coefficients.

6. A digital filter as in claim 5 including means for interpolating between said first and second coefficients.

7. In a dynamic digital audio filter for filtering an input audio signal wherein said filter includes first and second unit delays for forming first and second unit output delays having a first bit width wherein the first unit delay is one time unit and wherein the second unit delay is two time units, an unsigned multiplying means wherein an input to said multiplying means is a truncation of said first and second output delays each having a truncated bit width such that the truncated bit widths are less than said first bit width so as to form first and second truncated delays, an adding means, the method comprising the steps of providing a first unsigned coefficient and a second unsigned coefficient, providing said first unsigned coefficient times the first truncated delay and said second unsigned coefficient times the second truncated delay, receiving said first and second truncated delays, shifting the output of said first unit delay to multiply by two, forming a 2's complement of the output of said second unit delay, and forming an output delayed signal which is a sum of said input audio signal, the output of said first unit delay shifted to multiply by two, the 2's complement output of said second unit delay, a first unsigned coefficient times the first truncated delay, and a second unsigned coefficient times the second truncated delay.

* * * * *